United States Patent
Saito et al.

[11] Patent Number: 6,096,129
[45] Date of Patent: *Aug. 1, 2000

[54] METHOD OF AND APPARATUS FOR PRODUCING SINGLE-CRYSTALLINE DIAMOND OF LARGE SIZE

[75] Inventors: Hirohisa Saito; Takashi Tsuno; Takahiro Imai; Yoshiaki Kumazawa, all of Hyogo, Japan

[73] Assignee: Sumitomo Electric Industries, Ltd., Osaka, Japan

[ * ] Notice: This patent is subject to a terminal disclaimer.

[21] Appl. No.: 09/060,555

[22] Filed: Apr. 15, 1998

[30] Foreign Application Priority Data

Apr. 18, 1997  [JP]  Japan ................................. 9-101613
Feb. 25, 1998  [JP]  Japan ................................. 10-043325

[51] Int. Cl.[7] ................................................. C30B 23/04
[52] U.S. Cl. ................................. 117/84; 117/89; 117/93; 117/902; 117/913
[58] Field of Search ................................. 117/84, 89, 93, 117/94, 902, 913; 423/446

[56] References Cited

U.S. PATENT DOCUMENTS 5,127,983  7/1992  Imai et al. ................................. 117/85
5,474,021  12/1995  Tsuno et al. ............................... 117/97

FOREIGN PATENT DOCUMENTS 0589464   3/1994   European Pat. Off. .
0630994   12/1994  European Pat. Off. .
1103993   4/1989   Japan .
1103994   4/1989   Japan .
03075298A 3/1991   Japan .

OTHER PUBLICATIONS

Hideaki Maeda et al.: Determination of diamond [100] and [111] growth rate and formation of highly oriented diamond film by microwave plasma–assisted chemical vapor deposition; 1995 Materials Research Society, J. Mater. Res., vol. 10, No. 12, Dec. 1995, pp. 3115 to 3123.

Hiromu Shiomi et al.: Epitaxial Growth of High Quality Diamond Film by the Microwave Plasma–Assisted Chemical–Vapor–Deposition Method; 362 Japanese Journal of Applied Physics, 29(1990)Jan., No. 1, Part 1, Tokyo, JP, pp. 34 to 40.

"Growth kinetics of (100), (110), and (111) homoepitaxial diamond films", No. XP–002077253; by Chu et al.; Appl. Phys. Lett. 61 (12). Sep. 21, 1992; pp. 1393–1395.

"Growth of diamond films on copper"; No. XP–002077255; by Hartsell et al.; J. Mater. Res., vol. 9, No. 4, Apr. 1994; pp. 921–926.

"Morphology and Quantitiative Nitrogen Impurity Measurements in Homoepitaxial Chemical Vapor Deposited Diamond"; by Catledge et al.; Mat.Res.Soc.Symp.Proc.vol.441, 1997; pp. 635–640.

"Applied Physics", vol. 55, No. 7 (pp. 640–653) (1986) (w/Eng.Abstract).

"Mosaic" growth of diamond; Janssen et al.; Diamond and Related Materials, No. 4 (1995) pp. 1025–1031.

*Primary Examiner*—Felisa Hiteshew
*Attorney, Agent, or Firm*—W. F. Fasse; W. G. Fasse

[57] ABSTRACT

An initial single-crystalline diamond base material is prepared from a flat plate having a major surface and side surfaces consisting of low-index planes. Then, single crystalline diamond is homoepitaxially vapor-deposited on the single-crystalline diamond base material, and a resulting diamond material is cut and polished in a particular manner to provide a successive base material on which single-crystalline diamond is again grown, thereby forming a single-crystalline diamond having a large area. A holder for the single-crystalline diamond base material consists of or is coated with a material hardly forming a compound with carbon. Single crystalline diamond can be stably formed on the surfaces of the base material. Consequently, single-crystalline diamond of high quality having a large area can be stably produced in a shorter time using either plasma CVD or a thermal filament method.

27 Claims, 11 Drawing Sheets

METHOD OF AND APPARATUS FOR PRODUCING SINGLE-CRYSTALLINE DIAMOND OF LARGE SIZE

BACKGROUND OF THE INVENTION

1. Field of the Invention

The present invention relates to a method of and an apparatus for producing single-crystalline diamond through vapor-phase synthesis, and more particularly, it relates to a method of and an apparatus for producing relatively large-sized single-crystalline diamond of at least about 10 mm by 10 mm, which is applied to a cutting tool, a precision tool, a semiconductor material, an electronic component, an optical component or the like.

2. Description of the Prior Art

Diamond, which has many excellent properties such as high hardness, high heat conductivity and transparency, is widely employed as material for various tools, optical components, semiconductors, electronic components and the like, and its importance is expected to increase in the years ahead.

While naturally produced diamond has been applied to industrial use in the past, artificially synthesized diamond is generally employed at present. In general, relatively large-sized polycrystalline diamond is artificially produced by vapor-phase synthesis such as plasma CVD (chemical vapor deposition) (refer to "Applied Physics", Vol. 55, No. 7, 1986, pp. 640 to 563, for example). In such polycrystalline diamond, however, a polycrystalline diamond layer which is formed on a substrate is so heterogeneous that a sufficiently flat surface cannot be obtained by polishing. In application to a superprecision tool, an optical component or a semiconductor particularly requiring a flat surface, therefore, it is necessary to employ single-crystalline diamond having homogeneous crystal orientations. While such single-crystalline diamond is naturally produced, the output thereof is so small that a method of artificially producing single-crystalline diamond has been studied in general.

With the vapor-phase synthesis technique of plasma vapor deposition, single-crystalline diamond is generally produced by vapor-depositing single-crystalline diamond on a base material with a low- or high-temperature plasma which is generated by mixing at least one carbon source selected from hydrocarbon, carbon oxide, alcohol and acetone with hydrogen, oxygen, water, nitrogen or halogen for preparing source gas, and then decomposing and activating the source gas with a direct current, a low-frequency alternating current, a high frequency or a microwave. Alternatively, in the thermal filament method, single-crystalline diamond is produced by vapor-depositing single-crystalline diamond on a base material material with a thermoionic emissive material such as a tungsten filament that is heated to a high temperature. Using either method, the single-crystalline diamond can be homoepitaxially grown on a single-crystalline diamond base material or heteroepitaxially grown on a non-diamond base material, depending on the type of the employed base material. In the case of homoepitaxially growing the single-crystalline diamond, the base material may be prepared by bonding a plurality of single-crystalline diamond base materials that are adjacently arranged in the same plane with each other to attain a large area for mosaic growth (refer to Japanese Patent Laying-Open No. 3-75298 (1991), Diamond and Related Material, No. 4 (1995) pp. 1025 to 1031 etc.).

In the conventional homoepitaxial growth, however, abnormal growth is caused on side surfaces due to growth of twins or secondary nuclei, while transverse spreading is inhibited by polycrystalline diamond growing from a base material holder. In relation to the heteroepitaxial growth, on the other hand, a problem of inconsistency in in-plane orientation has not yet been solved although a technique for attaining regular orientations on the upper surface has been developed. With mosaic growth, inconsistent junctions between the single-crystalline diamond base materials remain as interfaces to cause abnormal growth, and hence the area of the single-crystalline diamond cannot be increased. In order to prevent formation of the interfaces, the angles of the base materials must be completely regularized.

In general, further, the base material holder is prepared from a material such as silicon, silicon carbide or cubic boron nitride that readily forms a compound by reaction with carbon, disadvantageously leading to formation of polycrystalline diamond that inhibits growth of single-crystalline diamond in the vicinity of the base material.

SUMMARY OF THE INVENTION

An object of the present invention is to provide a method of stably producing single-crystalline diamond having a large area, using either plasma CVD or a thermal filament method, and an apparatus for producing the same.

In order to attain the aforementioned object, the method of producing single-crystalline diamond according to the present invention is mainly characterized in that a base material having a major surface and side surfaces consisting of low-index planes is employed as a single-crystalline diamond base material for homoepitaxially vapor-depositing single-crystalline diamond on this base material, thereby forming single-crystalline diamond having a large area.

The term "low-index planes" is defined as indicating all of {100}, {110} and {111} planes and those forming angles within 5° with respect to these planes, as well as {311}, {331}, {511}, {551} and {711} planes and those forming angles within 1° with respect to these planes, in Miller indices.

Thus, the single-crystalline diamond base material is prepared from material having a major surface and side surfaces consisting of low-index planes that are stable in energy, whereby single-crystalline diamond can be stably grown on the surfaces of the base material for forming high-quality single-crystalline diamond having a large area.

In a preferred embodiment of the present invention, single-crystalline diamond is produced under a vapor deposition condition that increases the vapor deposition rate of the single-crystalline diamond on the low-index planes forming the side surfaces of the single-crystalline diamond base material. Due to selection of such a vapor deposition condition, single-crystalline diamond having a large area can be formed in a shorter time, thereby improving production efficiency.

In the single-crystalline diamond base material, the major surface preferably consists of a square plane having an inclination within 5° with respect to {100} planes, and the four side surfaces are preferably prepared from planes having an inclination within 5° with respect to {100} or {110} planes.

The ratio of a vapor deposition rate V<100> in a <100> direction to a vapor deposition rate V<111> in a <111> direction, i.e. a growth rate ratio defined as V<100>/V<111>, is employed as an index of the vapor deposition rate of the single-crystalline diamond on the side surfaces of the base material consisting of such low-index planes. A condition for homoepitaxial growth is determined in response to the plane orientation of the side surfaces of the base material. In more concrete terms, the single-crystalline diamond is grown under a <100> orientation growth condition at a growth rate ratio of at least 1.62, particularly preferably at least $3^{0.5}$, when the side surfaces of the base material are formed by {100} planes. On the other hand, the single-crystalline diamond is grown under a <110> orientation condition at a growth rate ratio of 0.81 to 0.92, particularly preferably $0.5 \times 3^{0.5}$, when the side surfaces are formed by {110} planes, or under a <111> orientation growth condition at a growth rate ratio of not more than 0.64, particularly preferably not more than $3^{-0.5}$, when the side surfaces are formed by {111} planes. When the side surfaces are formed by two plane orientations, the single-crystalline diamond is grown under a condition responsive to either plane orientation. Thus, the growth rate toward this orientation is at the maximum on extensions of the side surfaces and thereby hardly causes abnormal growth, whereby regions including abnormal growth can be limited.

In another preferred embodiment of the present invention, the single-crystalline diamond base material is prepared from material having a major surface consisting of a square plane having an inclination within 5° with respect to {100} planes and four side surfaces consisting of planes having an inclination within 5° with respect to {100} planes, using a vapor deposition condition that will provide the greatest increase in the vapor deposition rate of the single-crystalline diamond with respect to {111} planes.

When such a <111> orientation condition is employed in place of the <110> orientation condition, the thickness of the {110} side surfaces is not gradually reduced as growth progresses, dissimilarly to the case of the <110> orientation condition, whereby single-crystalline diamond base having a larger area can be readily formed.

According to the present invention, the single-crystalline diamond is vapor-deposited on the major surface and the side surfaces of the single-crystalline diamond base material and thereafter cut out by cutting the base material along a plane substantially perpendicular to the major surface so that low-index planes different from the side surfaces before vapor deposition form new side surfaces, thereby removing twins or secondary nuclei abnormally growing during homoepitaxial growth.

In still another preferred embodiment of the present invention, the single-crystalline diamond base material is prepared from material having four side surfaces consisting of planes having an inclination within 5° with respect to {100} planes. Prior to the step of cutting the base material along a plane substantially perpendicular to the major surface of the base material for cutting out single-crystalline diamond that is substantially in the form of a rectangular parallelepiped he inventive method further comprises a step of removing (by grinding or polishing) portions of material between an upper surface and the upper major surface of the single-crystalline diamond base material and between a lower surface and upper ends of inclined surfaces growing from lower sides of the four side surfaces when the upper ends of the inclined surfaces reach the vertical position of the upper major surface of the single-crystalline diamond base material or a preceding stage.

The aforementioned portions are removed by polishing when the upper ends of the inclined surfaces growing from the lower sides of the four side surfaces reach the vertical position of the upper major surface of the single-crystalline diamond base material or in the preceding stage since unnecessary portions are formed if the single-crystalline diamond is continuously grown after the inclined surfaces reach the upper major surface of the single-crystalline diamond base material, contrary to the object of the present invention for quickly forming large-sized single-crystalline diamond.

In order to improve the production efficiency by growing the single-crystalline diamond in portions providing largest areas, it is preferable to advance to a next step when the inclined surfaces growing from the lower sides of the four side surfaces reach the upper surface of the single-crystalline diamond base material (to positions shown by broken lines in FIG. 3B).

In a further preferred embodiment of the present invention, the single-crystalline diamond base material is prepared from material having four side surfaces consisting of planes having an inclination within 5° with respect to {110} planes. Prior to the step of cutting the base material along a plane substantially perpendicular to the major surface of the base material for cutting out single-crystalline diamond that is substantially in the form of a rectangular parallelepiped, the method further comprises the following steps. A first step involves removing a portion of material between an upper surface formed by growth of the upper major surface of the base material and a plane that includes edge lines formed by intersection lines between pairs of inclined surfaces, have an angle within 5° with respect to {110} planes, and that were vertically oppositely grown on the four side surfaces respectively, in order to form a new growth-start major surface consisting of a plane having an inclination within 5° with respect to a {111} plane when the pairs of inclined surfaces grow until the intersection lines therebetween form the edge lines and cover up the growth planes that are parallel to the four side surfaces or in a preceding stage. A next step involves vapor-depositing the single-crystalline diamond on the new growth start major surface. Thereafter, a further step involves removing a portion of material between the lower surface and the new growth start major surface.

The steps of removing the portion of material between the upper surface formed by growth of the major surface and the plane that includes the edge lines when the intersection lines between the pairs of inclined surfaces have grown to form the edge lines to so as to cover up the growth planes that are parallel to the four side surfaces of the single-crystalline diamond base material, or in the preceding stage, are carried out because the size of the single-crystalline diamond plane which can be cut out from the single-crystalline diamond base material after the growth has progressed beyond the point where the edge lines converge to form the intersection lines (the stage grown to the positions shown by broken lines in FIG. 9B) does not increase. Rather, only polycrystalline diamond portions that are regarded as defective in the inventive method are increased and this is contrary to the object of the present invention of quickly forming large-sized single-crystalline diamond. In order to improve the production efficiency by maximizing the area of the single-crystalline diamond that can be cut out from the base material, it is preferable to advance to a next step when the four side surfaces are just covered or caused to disappear due to the growth of the pairs of inclined surfaces.

The step of cutting out the single-crystalline diamond substantially in the form of a rectangular parallelepiped by cutting the base material along the planes substantially perpendicular to the major surface includes a step of cutting out the diamond so that planes having an inclination within 5° with respect to {100} planes form new side surfaces when planes having an inclination within 5° with respect to {100} planes form the side surfaces before cutting, or a step of cutting out the diamond so that planes having an inclination within 5° with respect to {100} planes form new side surfaces when planes having an inclination within 5° with respect to {110} planes form the side surfaces before cutting.

According to the inventive method of producing single-crystalline diamond, single-crystalline diamond having a large area is formed by alternately repeating steps of vapor depositing single-crystalline diamond onto single-crystalline diamond base material and then cutting the single-crystalline diamond into a rectangular parallelepiped shape. According to the invention, the steps of cutting include alternately repeating a step of cutting out single-crystalline diamond having side surfaces consisting of planes having an inclination within 5° with respect to {100} planes before cutting so that planes having an inclination within 5° with respect to {110} planes form new side surfaces, and a step of cutting out single-crystalline diamond having side surfaces consisting of planes having an inclination within 5° with respect to {110} planes before cutting so that planes having an inclination within 5° with respect to {100} planes form new side surfaces.

The inventive apparatus for producing single-crystalline diamond enabling excellent implementation of the aforementioned method of producing single-crystalline diamond according to the present invention comprises a reaction vessel, source gas supply means for supplying source gas for vapor-depositing diamond into the reaction vessel, exhaust means for discharging the gas from the reaction vessel and decompressing the same, and base material holding means for holding a single-crystalline diamond base material in the reaction vessel. At least a portion of the base material holding means in the vicinity of a region for receiving the single-crystalline diamond base material that consists of a material hardly forms a compound with carbon or is coated with a material that hardly forms a compound with carbon.

According to this structure, precipitation of diamond from the base material holding means is suppressed, thereby suppressing formation of polycrystalline diamond, which inhibits the growth of single-crystalline diamond. Consequently, an excited diamond precursor is hardly caught on the holding means, which increases the probability that the precursor will reach the side surfaces of the base material. This further improves the efficiency of quickly producing single-crystalline diamond having a large area.

In such a base material holding means, at least the portion in the vicinity of the region for receiving the single-crystalline diamond base material preferably consists of any material selected from copper, platinum, iridium, molybdenum, graphite, gold, silver, nickel and cobalt, or is preferably coated with any of these materials.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 10:
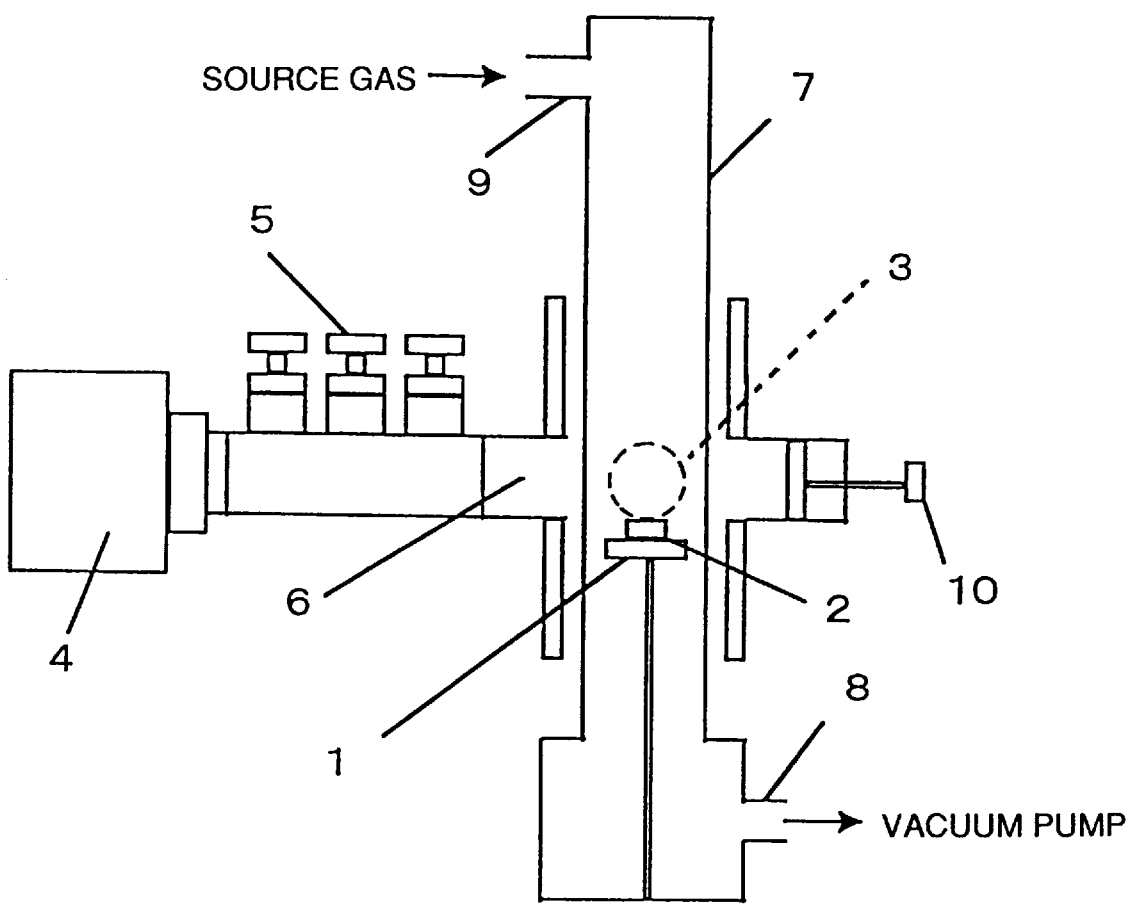
FIG. 10 is a model diagram showing a microwave CVD apparatus employed for an experiment in Example 1 of the present invention.

FIG. 10 is a model diagram showing a microwave CVD apparatus for diamond vapor-phase synthesis employed for an experiment in Example 1 of the present invention. In the microwave CVD apparatus shown in FIG. 10, a microwave generator comprising a microwave power source 4, an isolator, tuners 5 and the like generates microwaves, which are directed to a plunger 10 through a waveguide 6. The waveguide 6 is provided in an intermediate position thereof with a silica tube 7 that serves as a reaction vessel. The silica tube 7 is provided with a source gas inlet port 9 and an outlet port 8 on its upper and lower portions respectively. A base material holder 1 is arranged at a position of the silica tube 7 that intersects with the waveguide 6, so that a base material 2 can be set on this base material holder 1.

Figure 1A:
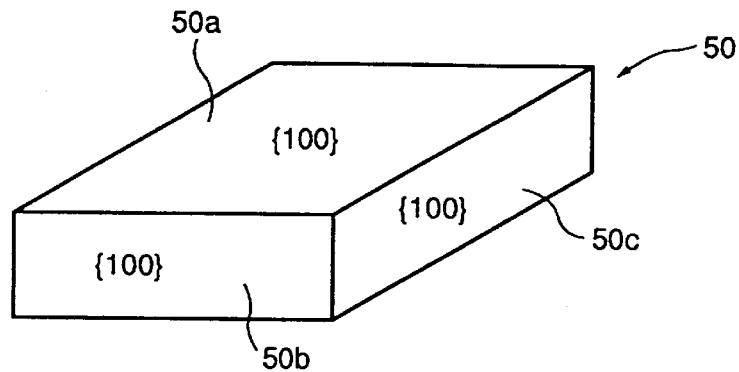
FIG. 1A is a perspective view showing an initial single-crystalline diamond base material having an upper surface of a square {100} plane and side surfaces of {100} planes, which will be employed in each pertinent Example of the present invention.
Figure 1B:
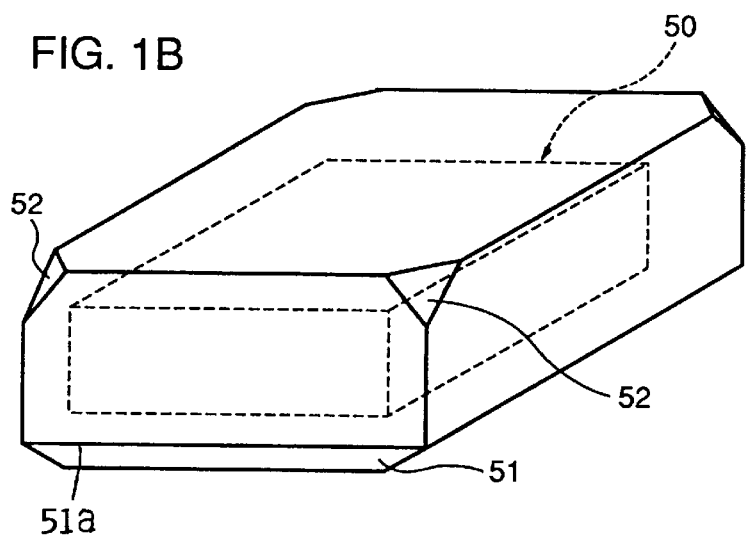
FIG. 1B is a perspective view showing a shape of the single-crystalline diamond base material shown in FIG. 1A in an intermediate growth stage during prescribed vapor deposition.
Figure 3A:
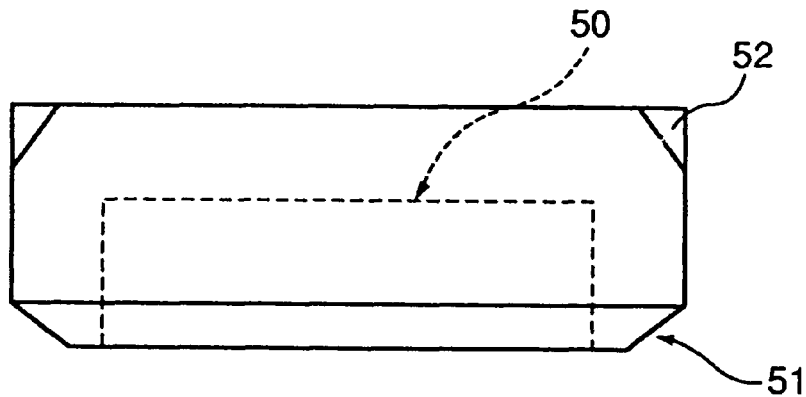
FIG. 3A illustrates the single-crystalline diamond base material in the intermediate growth stage shown in FIG. 1B as viewed from a side surface.
Figure 4A:
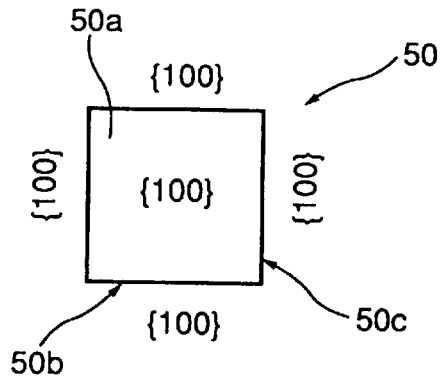
FIG. 4A is a plan view of the initial single-crystalline-diamond base material shown in FIG. 1A.
Figure 4B:
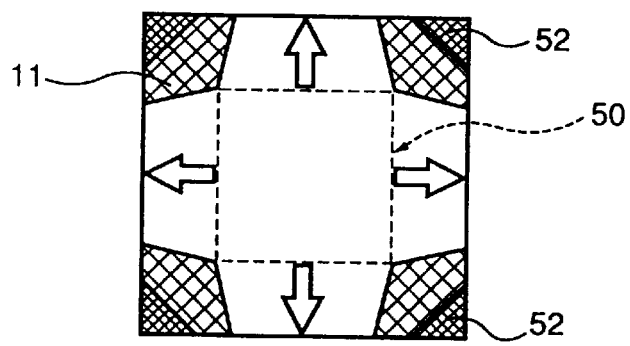
FIG. 4B is a plan view of the single-crystalline diamond base material in the vapor deposition stage shown in FIG. 1B.

A base material (hereinafter referred to as a prime base material) 50 shown in FIGS. 1A and 4A is prepared from single-crystalline diamond of at least 0.5 mm in thickness having an upper surface 50a of a square {100} plane and side surfaces 50b and 50c of {100} planes and is set on the base material holder 1, which is made of molybdenum, in the microwave CVD apparatus shown in FIG. 10. Then, diamond is homoepitaxially grown under a <100> preferential orientation growth condition at a growth rate ratio of about $3^{0.5}$ with methane-hydrogen mixed gas having a methane concentration of 10±0.5% while maintaining the pressure in the reaction vessel 7 at 140±5 Torr and the temperature of the prime base material 50 at 1000±10° C. Under these conditions diamond grows as shown in FIGS. 1B, 3A and 4B so that inclined surfaces 51 appear from lower portions of the side surfaces 50b and 50c of the prime base material 50 while abnormal growing parts 11 (see FIG. 4B) and depressed parts 52 appear on the four corners and upper corner portions of an upper surface respectively.

Figure 1C:
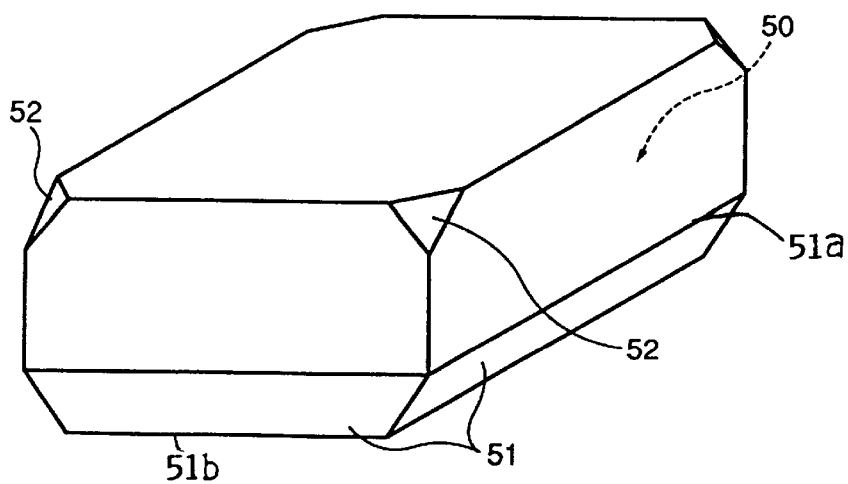
FIG. 1C is a perspective view showing a shape of the single-crystalline diamond base material with upper ends of inclined surfaces growing from lower ends of the side surfaces reaching the vertical position of the upper major surface of the initial single-crystalline diamond base material.
Figure 2A:
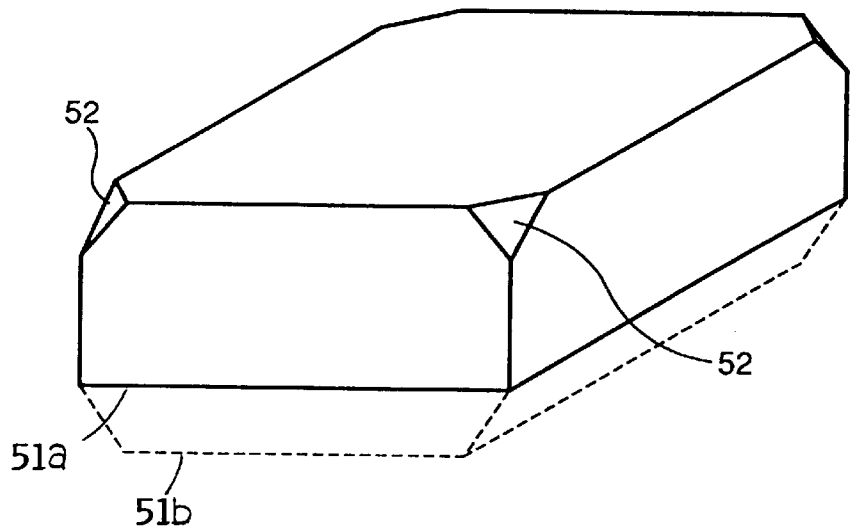
FIG. 2A is a perspective view showing a shape of the single-crystalline diamond base material shown in FIG. 1C after removing a portion between a lower surface and the upper ends of the inclined surfaces by polishing.
Figure 2B:
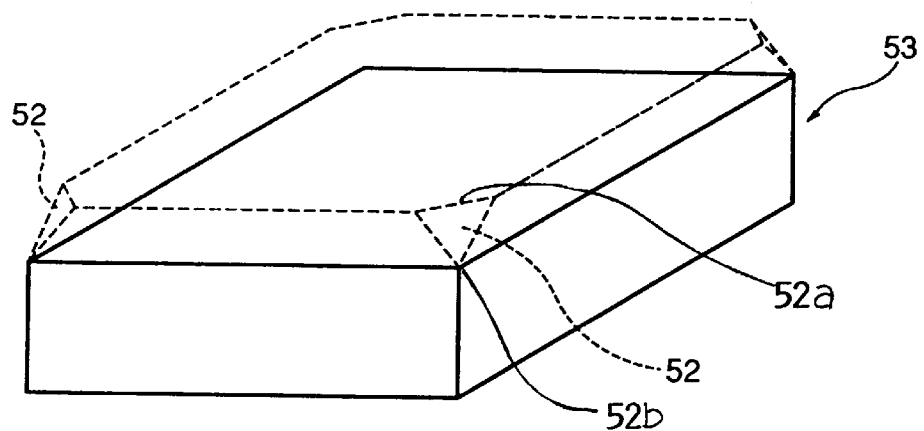
FIG. 2B is a perspective view showing a shape of the single-crystalline diamond base material shown in FIG. 2A after removing a portion between an upper surface and depressed parts on four upper corners by polishing.
Figure 2C:
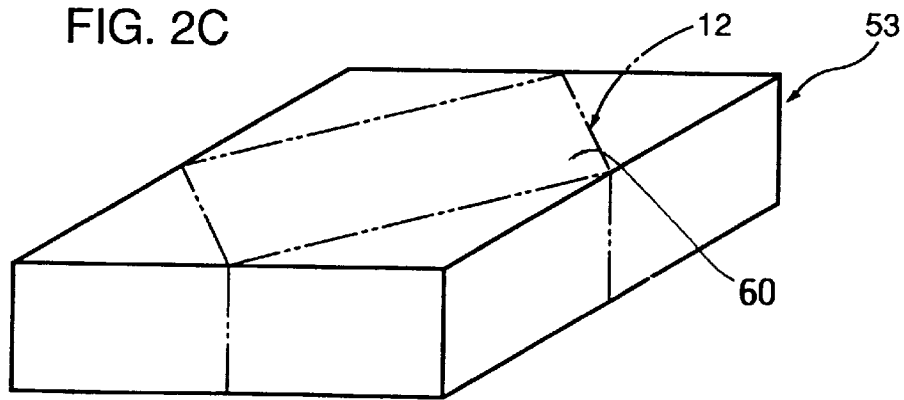
FIG. 2C is a perspective view showing positions for cutting the single-crystalline diamond base material formed through the step shown in FIG. 2B.
Figure 3B:
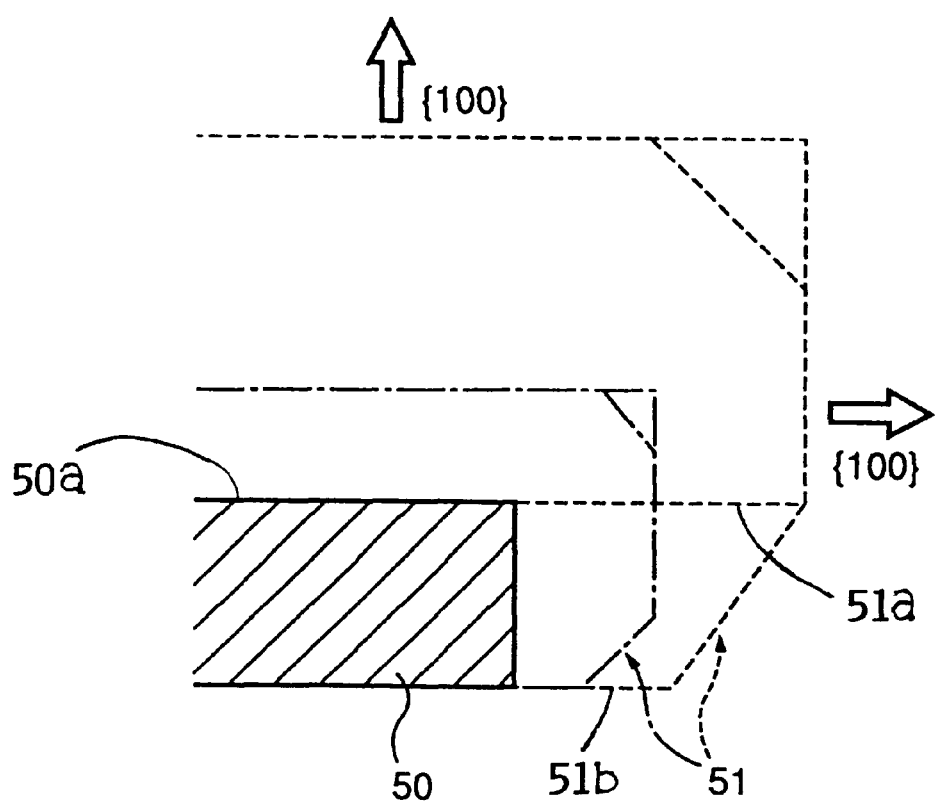
FIG. 3B is a model diagram for illustrating the change of the shape of the single-crystalline diamond base material from the state shown in FIG. 1B to that shown in FIG. 1C during the growth process, as viewed from the side surface.
Figure 4C:
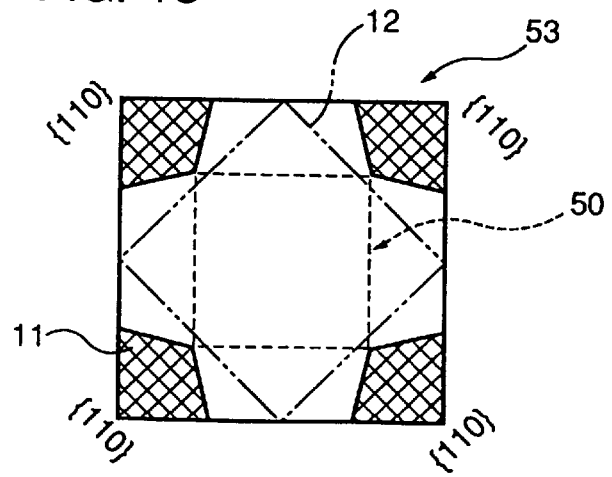
FIG. 4C is a plan view showing the single-crystalline diamond base material in the stage before the cutting step shown in FIG. 2C.
Figure 8A:
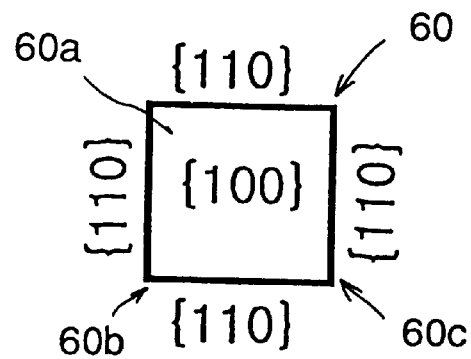
FIG. 8A is a plan view of the initial single-crystalline diamond base material shown in FIG. 5A.

Thereafter the diamond further grows without abnormal growth on extensions of the {100} side surfaces 50b and 50c as shown in FIG. 1C, so that an upper end 51a of each inclined surface 51 reaches a position shown by a broken line in FIG. 3B, i.e. the position of the upper major surface 50a of the prime base material 50. In this stage, the portion between a lower surface 51b and the upper ends 51a of the inclined surfaces 51 shown by broken lines in FIG. 2A is removed by polishing, and thereafter the portion shown by broken lines in FIG. 2B, i.e. between an upper surface 52a and lower ends 52b of the depressed parts 52 on the four corners of the upper surface 50a is polished so as to remove the portion including the depressed parts 52, thereby forming a diamond substrate 53 which is in the form of a rectangular parallelepiped that includes the abnormal growing parts 11, as shown in FIGS. 2C and 4C. This substrate 53 is cut along cut lines 12 shown in FIGS. 2C and 4C with a YAG laser beam, thereby forming a flat single-crystalline diamond substrate (prime base material) 60 having an upper surface 60a consisting of a square {100} plane and four side surfaces 60b and 60c consisting of {110} planes, as shown in FIGS. 5A and 8A.

Figure 5A:
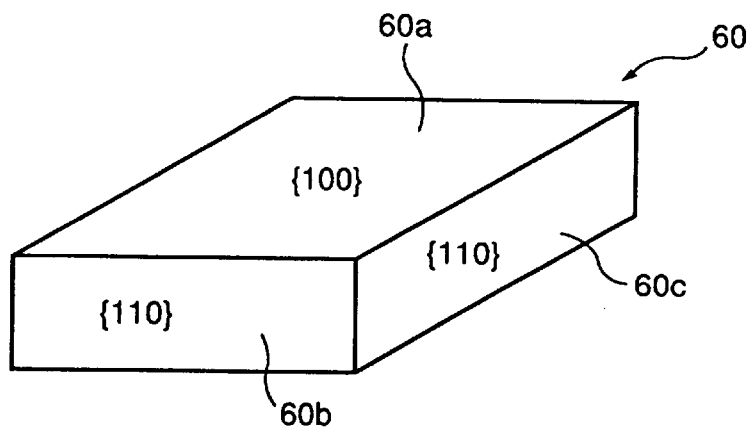
FIG. 5A is a perspective view showing an initial single-crystalline diamond base material having an upper surface of a square {100} plane and side surfaces of {110} planes, which will be employed in each pertinent Example of the present invention.
Figure 5B:
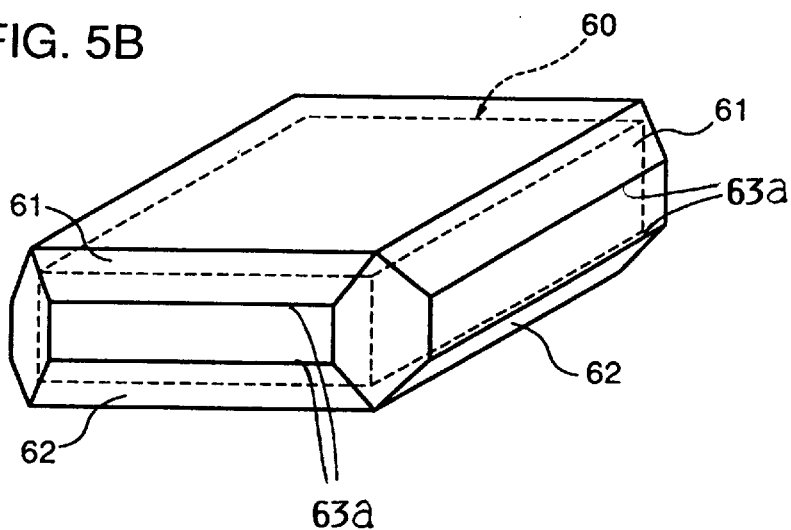
FIG. 5B is a perspective view showing a shape of the single-crystalline diamond base material shown in FIG. 5A in an intermediate growth stage during prescribed vapor deposition.
Figure 7A:
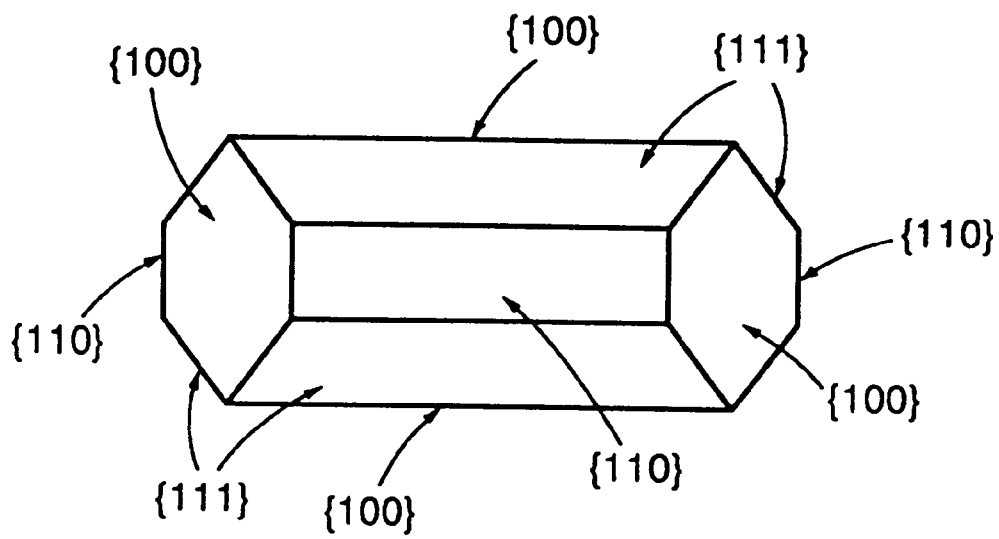
FIG. 7A illustrates the single-crystalline diamond base material in the intermediate growth stage shown in FIG. 5B as viewed from a side surface.
Figure 8B:
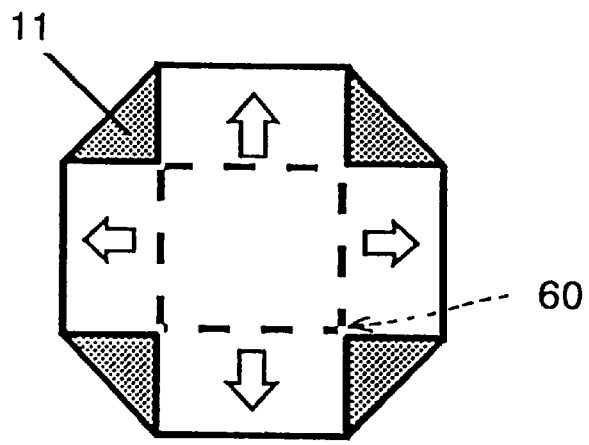
FIG. 8B is a plan view of the single-crystalline diamond base material in the vapor deposition stage shown in FIG. 5B.

Then, diamond is grown under a <110> preferential orientation growth condition at a growth rate ratio of 0.5 ×$3^{0.5}$ with methane-hydrogen mixed gas having methane concentration of 3+0.5% while maintaining the pressure in the reaction vessel 7 at 140±5 Torr and the temperature of the prime base material 60 at 1050±10° C., whereby the diamond grows as shown in FIGS. 5B and 7A. Due to the aforementioned step, inclined surfaces 61 and 62 appear as shown in FIGS. 5B and 8B from upper and lower ends of the four side surfaces 60b and 60c of the prime base material 60 shown in FIGS. 5A and 8A. While abnormal growing parts 11 appear on the four corners of the prime base material 60, the diamond grows with no abnormal growth on the extensions of the {110} side surfaces 60b and 60c.

Figure 5C:
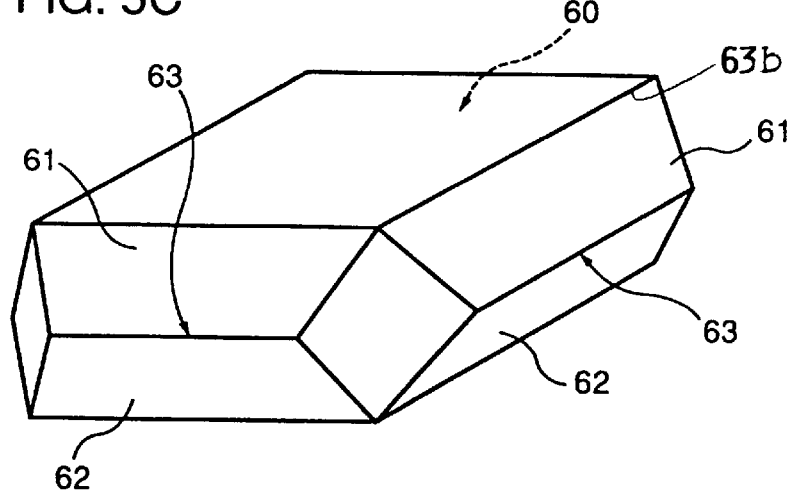
FIG. 5C is a perspective view showing a shape of the single-crystalline diamond base material in a stage when intersection lines of pairs of inclined surfaces oppositely growing from upper and lower ends of the side surfaces form edge lines.
Figure 6A:
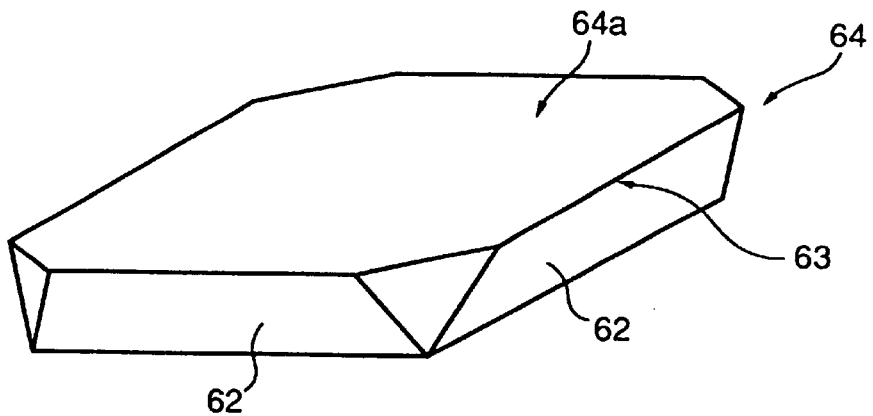
FIG. 6A is a perspective view showing a shape of the single-crystalline diamond base material after removing a portion between an upper surface of the single-crystalline diamond base material shown in FIG. 5C and a plane including the edge lines formed by the pairs of intersection lines by polishing.
Figure 6B:
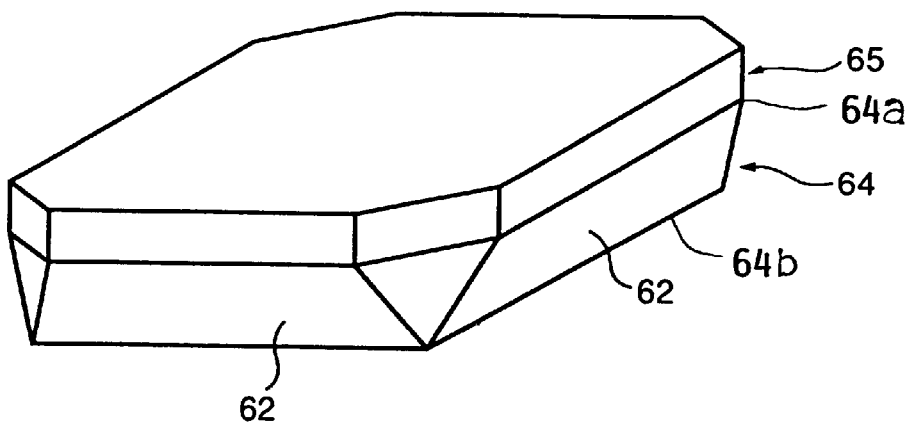
FIG. 6B is a perspective view showing a shape of the single-crystalline diamond base material shown in FIG. 6A after performing prescribed vapor deposition from a growth-start surface defined by the upper surface of the single-crystalline diamond base material.
Figure 6C:
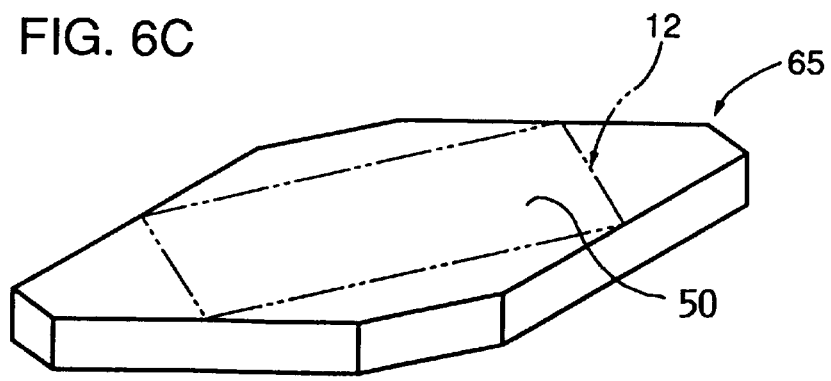
FIG. 6C is a perspective view showing a shape of the single-crystalline diamond base material after removing a portion between a lower surface formed through the step shown in FIG. 6B and the growth start surface by polishing, with cut positions for a subsequent cut-out step shown by broken lines.
Figure 8C:
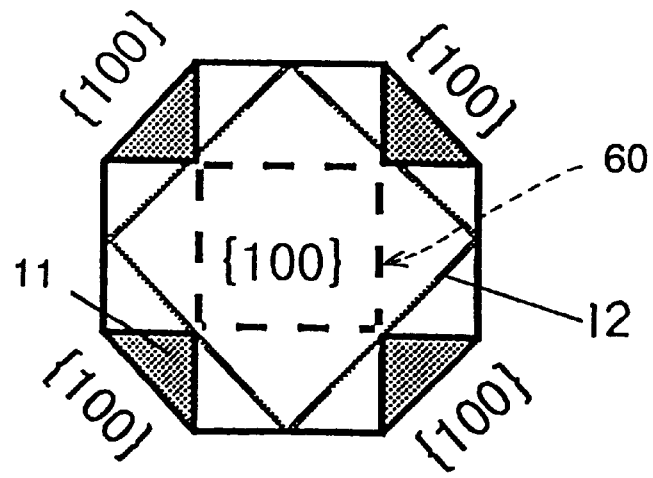
FIG. 8C is a plan view of the single-crystalline diamond base material before the cut-out step shown in FIG. 6C.

The diamond grows until intersection lines 63a between the inclined surfaces 61 and 62 appearing from the upper and lower ends of the side surfaces 60b and 60c form edge lines 63 as shown in FIG. 5C. A portion between an upper surface 63b and a plane that includes the edge lines 63 is removed by polishing so that a surface having no abnormal growth appears as a front surface, thereby forming a substrate 64 having a growth start surface 64a shown in FIG. 6A. Then, the <100> preferential orientation growth condition is applied to homoepitaxially grow diamond on the growth-start surface 64a, thereby forming a single-crystalline diamond layer 65 on the substrate 64, as shown in FIG. 6B. Thereafter the substrate 64 located under the single-crystalline diamond layer 65 is removed by polishing from a lower surface 64b, to obtain the flat single-crystalline diamond layer 65 including the abnormal growing parts 11 on the four corners as shown in FIGS. 6C and 8C. This single-crystalline diamond layer 65 is cut with a YAG laser beam along cut lines 12 shown in FIG. 6C, thereby forming single-crystalline diamond 50 having an upper surface 50a and four side surfaces 50b and 50c all consisting of {100} planes and having no abnormal growing parts, as shown in FIG. 1A. Flat single-crystalline diamond having a large area can be obtained by repeating the aforementioned steps.

While the <110> preferential orientation growth condition is employed in the homoepitaxy step shown in FIG. 5A with the single-crystalline substrate 60 serving as a prime base material in this Example, the object of the present invention can also be attained by employing a <111> preferential orientation growth condition to obtain the greatest increase in the growth rate in <111> directions, instead of the <110> preferential orientation growth condition, for the following reason.

It is generally known that isolated grains of diamond that are formed by homoepitaxy from points are generally formed by two types of planes, i.e. {100} and {111} planes. This is because the diamond mainly grows toward the {100} and {111} planes in <100> and <111> directions while relatively hardly growing toward the remaining planes. As understood from the fact that the growth rate ratio as an index specifying each orientation growth direction, is defined as the ratio of the vapor deposition rate V<100> in the <100> direction to the vapor deposition rate V<111> in the <111> direction, it is therefore also known that the growth rates toward the remaining low-index planes are determined by the large-small relation between the growth rates in the <100> and <111> directions.

Figure 7B:
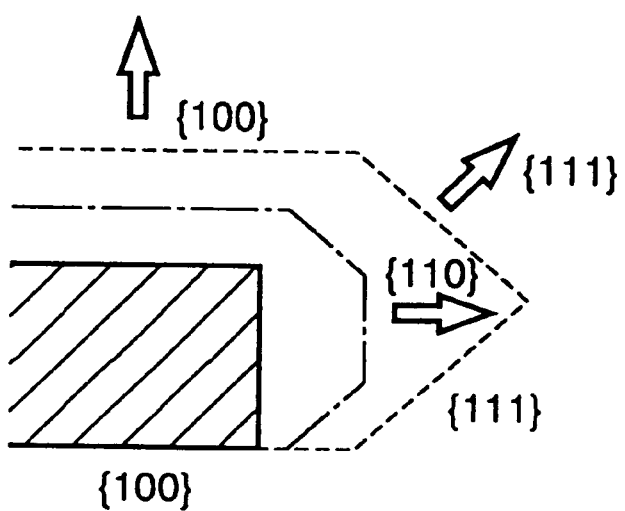
FIG. 7B is a model diagram illustrating the change of the shape of the single-crystalline diamond base material from the state shown in FIG. 5B to that shown in FIG. 5C during the growth process, as viewed from the side surface.

When the <110> preferential orientation growth condition is applied to the prime base material 60 shown in FIG. 5A as described above, the growth rate ratio is $0.5 \times 3^{0.5}$ and the vapor deposition rate in the <111> direction is higher than that in the <100> direction, whereby the growth of the diamond is remarkably influenced by the vapor deposition in the <111> direction. Therefore, the diamond grows into the shape shown in FIG. 7A after vapor deposition, and the thickness of each {110} plane is gradually reduced as shown in FIG. 7B, thereby reducing the thickness of each region, that causes no abnormal growth. When the <111> preferential orientation growth condition is applied to the prime base material 60 shown in FIG. 5A in place of the <110> preferential orientation condition, on the other hand, it is possible to grow the diamond without reducing the thickness of the regions that do not cause abnormal growth. Namely, the object of the present invention can also be attained by applying the <111> orientation growth condition dissimilarly to the <110> orientation growth condition to achieve the greatest increase in the growth rate toward the side surfaces, when homoepitaxially growing diamond on a prime base material having a major surface of a {100} plane and side surfaces of {110} planes.

A method of obtaining single-crystalline diamond having the largest area in the cutting step with a YAG laser beam in this Example is now described. The step of cutting the prime base material 50 or 60 with the YAG laser beam along the cut lines 12 described with reference to FIGS. 2C and 4C or 6C and 8C is carried out when single-crystalline diamond grows on the side surfaces 50b and 50c or 60b and 60c of the single-crystalline diamond base material 50 or 60, respectively to a thickness of not more than 50% of the initial length of each side. If the prime base material 50 or 60 is cut when the single-crystalline diamond grows on the side surfaces 50b and 50c or 60b and 60c to a thickness exceeding 50% of the initial length of each side, large portions of material without abnormal growth are removed, contrary to the object of the present invention to quickly form single-crystalline diamond having a larger area. In order to maximize the production efficiency, however, it is preferable to cut out the single-crystalline diamond when growth on the side surfaces 50b and 50c or 60b and 60c of the prime base material 50 or 60, respectively, has attained a thickness of about 50% of the initial length of each side.

Figure 9A:
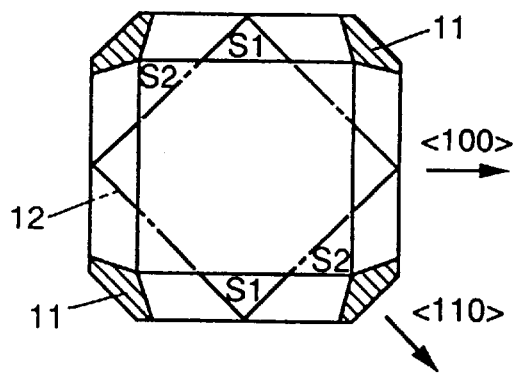
FIG. 9A is a plan view in case of, illustrating cutting the base material along cut lines 12 forming a square when the growth thickness toward a {100} plane in a <100> direction is preferably about 22% of the initial length of each side of the base material in order to cut out diamond in the form of a square pole.
Figure 9B:
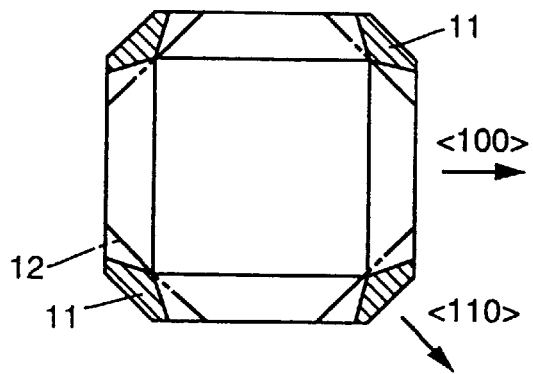
FIG. 9B is a plan view illustrating cutting the base material along cut lines 12 forming a square on corner portions when the growth thickness toward a {100} plane in a <100> direction is preferably about 22% of the initial length of each side of the base material similarly to the case shown in FIG. 9A, in order to cut out diamond in the form of an octagonal pole.
Figure 9C:
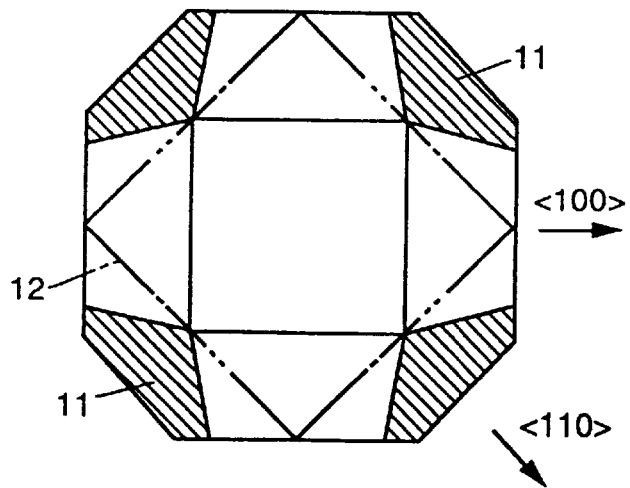
FIG. 9C is a plan view illustrating cutting the base material along cut lines 12 forming a square when the vapor deposition thickness toward a {100} plane in a <100> direction is preferably about 50% of the initial length of each side of the base material, in order to cut out diamond in the form of a square pole.

FIGS. 9A to 9C illustrate preferable ranges of growth thicknesses of single-crystalline diamond toward side surfaces of base materials for the stages of cutting the base materials. First, consider the case of cutting the base material into the form of a square pole having no abnormal growing parts 11 when the growth thickness toward each {100} plane in a <100> direction is about 22% of the initial length of each side of the base material. Cut lines 12, shown in FIG. 9A, form respective sides of a square, i.e. along {110} planes in four corners. In this case, the area s1 of a triangle formed on each corner of diamond, that is cut out from the initial base material and remains as a new corner of the diamond after it is cut is substantially identical to the area s2 of each previously grown part that is cut off. Consequently, the plane area of the cut base material is substantially equal to that of the base material. If the base material is cut along the {110} planes across the four corners to form a square pole while removing the abnormal growing parts when the growth thickness toward the {100} planes in the <100> directions is not in excess of about 22% of the initial length of each side of the base material, the plane area of the cut base material is then merely identical to or smaller than that of the initial base material. When cutting out diamond in the form of a flat square, therefore, it is necessary to cut the base material when the growth thickness toward the {100} planes in the <100> directions is at least in excess of about 22% of the initial length of each side of the base material.

Even if the growth thickness toward the {100} planes in the <100> directions is not in excess of about 22% of the initial length of each side of the base material, however, it is possible to obtain a single-crystalline diamond base material having a larger plane area than the initial one by cutting the base material along the lines 12, i.e. along {110} planes on the corner portions so as to cut out diamond in the form of an octagonal pole that includes {100} and {110} planes on its side surfaces, while removing abnormal growing parts 11, as shown in FIG. 9B.

When the growth thickness toward {100} planes in <100> directions is about 50% of the initial length of each side of the base material, cutting the base material along cut lines 12 forming a square, i.e. cutting along {110} planes on four corners to form a square pole while removing abnormal growing parts 11, will result in a new base material having a plane area of about twice the initial one, as can be seen in FIG. 9C. This provides the greatest improvement in efficiency when considering the yield of single-crystalline diamond from which the abnormal growing parts 11 are removed. When the base material is cut after the diamond grows to a growth thickness in excess of 50%, however, single-crystalline diamond portions are excessively removed when removing the abnormal growing parts 11 and the obtained plane area is merely identical to that in the case of 50%. Therefore, the diamond is preferably cut out by cutting the base material along the {110} planes on the four corners when the growth thickness toward the {100} planes in the <100> directions is not more than 50% of the initial length of each side of the base material, and it is most optimum to cut out the diamond when the growth thickness is 50%.

EXAMPLE 2

Example 2 of the present invention for vapor-phase synthesizing single-crystalline diamond using a thermal filament method is now described.

Figure 11:
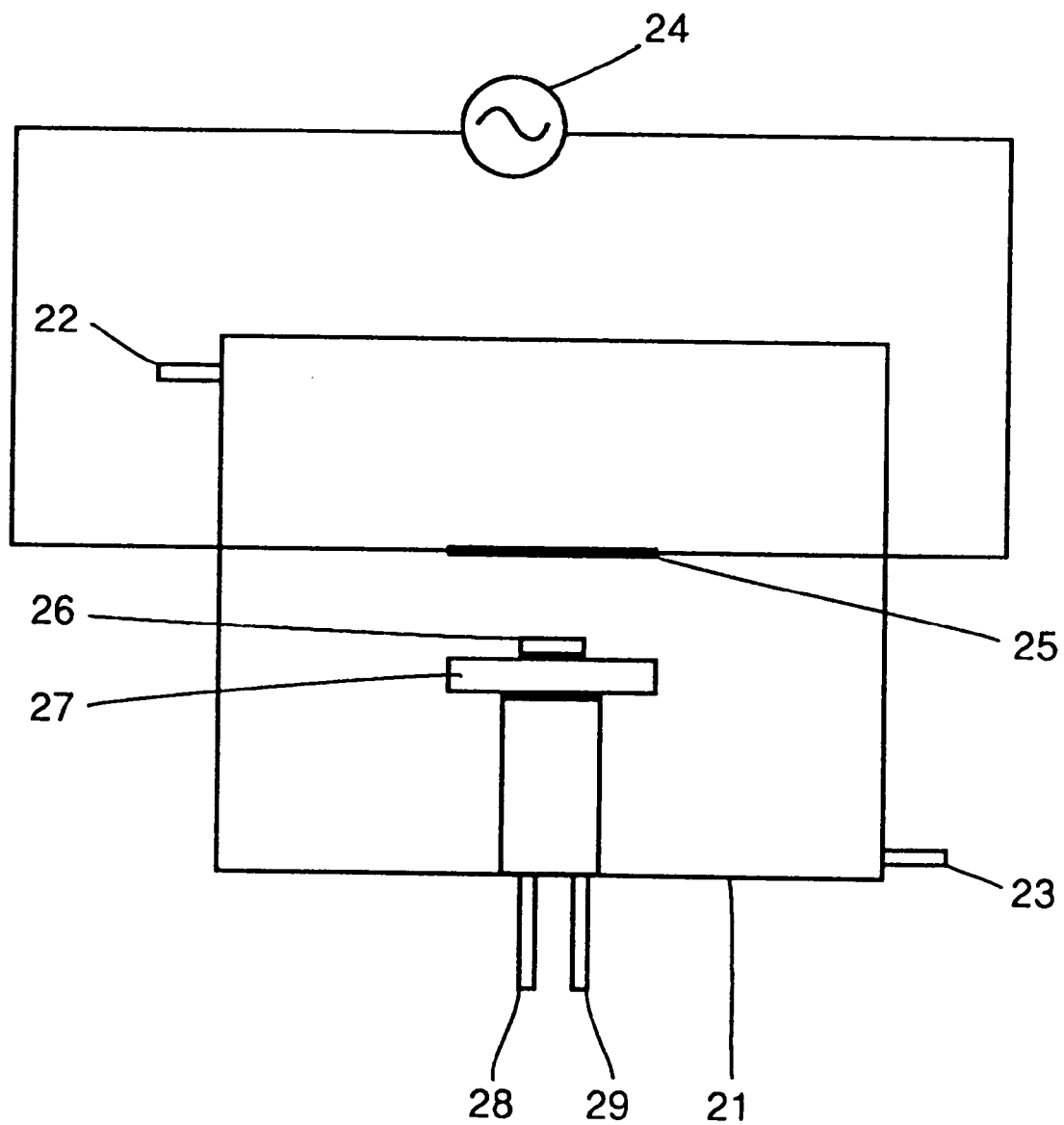
FIG. 11 is a model diagram showing a thermal filament CVD apparatus for diamond vapor-phase synthesis employed for an experiment in Example 2 of the present invention.

FIG. 11 is a model diagram showing a thermal filament CVD apparatus for diamond vapor-phase synthesis employed for an experiment. In the thermal filament CVD apparatus shown in FIG. 11, a reaction vessel 21 is provided with an inlet port 22 and an outlet port 23 for source gas. A tungsten filament 25 is arranged in the reaction vessel 21, and an ac power source 24 feeds a current for red-heating the tungsten filament 25. A base material holder 27 of molybdenum is arranged under the tungsten filament 25, for receiving a single-crystalline diamond base material 26. An inlet port 28 and an outlet port 29 for cooling water are provided for supplying cooling water to a lower portion of the base material holder 27 which is heated to a high temperature by the red-heated tungsten filament 25.

The single-crystalline diamond base material 26 is prepared from the single-crystalline diamond base material (prime base material) 50 of at least 0.5 mm in thickness having the upper surface 50a of a square {100} plane and the side surfaces 50b and 50c of {100} planes as shown in FIGS. 1A and 4A. The base material 26 is set on the base material holder 27 of molybdenum provided in the aforementioned thermal filament CVD apparatus. Diamond is homoepitaxially grown under a <100> preferential orientation growth condition at a growth rate ratio of about $3^{0.5}$ using methane-hydrogen mixed gas having a methane concentration of 1.3% while maintaining the pressure in the reaction vessel 21 at 100 Torr and the temperature of the prime base material 50 at 850° C. Under these conditions, diamond grows as shown in FIGS. 1B, 3A and 4B so that inclined surfaces 51 appear from lower portions or edges of the side surfaces 50b and 50c of the prime base material 50 while abnormal growing parts 11 (see FIG. 4B) and depressed parts 52 appear on four corners and upper corner portions of an upper surface respectively.

Thereafter the diamond further grows with no abnormal growth on the extensions of the {100} side surfaces 50b and 50c as shown in FIG. 1C, so that an upper end 51a of each inclined surface 51 reaches the position shown by the broken line in FIG. 3B, i.e. the position of the upper major surface 50a of the prime base material 50. In this stage, the portion between a lower surface 51b and the upper ends 51a of the inclined surfaces 51 shown by broken lines in FIG. 2A is removed by polishing, and thereafter the portion shown by broken lines in FIG. 2B, i.e., between the upper surface 52a and lower ends 52b of the depressed parts 52 on the four corners of the upper surface is polished to remove the depressed parts 52, thereby forming a diamond substrate 53 which is in the form of a rectangular parallelepiped that includes the abnormal growing parts 11, as shown in FIGS. 2C and 4C. This substrate 53 is cut along cut lines 12 shown in FIGS. 2C and 4C with a YAG laser beam, thereby forming a flat single-crystalline diamond substrate (prime base material) 60 having an upper surface 60a consisting of a square {100} plane and four side surfaces 60b and 60c consisting of {110} planes, as shown in FIGS. 5A and 8A.

Then, diamond is grown under a <110> preferential orientation growth condition at a growth rate ratio of 0.5× $3^{0.5}$ with methane-hydrogen mixed gas having methane concentration of 1.2% while maintaining the pressure in the reaction vessel 27 at 100 Torr and the temperature of the prime base material 60 at 850° C. Under these conditions, diamond grows as shown in FIGS. 5B and 7A. Due to the aforementioned step, inclined surfaces 61 and 62 appear as shown in FIGS. 5B and 8B from upper and lower ends of the four side surfaces 60b and 60c of the prime base material 60 shown in FIGS. 5A and 8A. While abnormal growing parts 11 appear on four corners of the prime base material 60, the diamond grows with no abnormal growth on extensions of the {110} side surfaces 60b and 60c.

The diamond grows until intersection lines 63a between the inclined surfaces 61 and 62 appearing from the upper and lower ends of the side surfaces 60b and 60c form edge lines 63 as shown in FIG. 5C. Then, a portion between an upper surface 63b and a plane including the edge lines 63 is removed by polishing so that a surface having no abnormal growth appears as a front surface, thereby forming a substrate 64 having a growth-start surface 64a shown in FIG. 6A. Then, the <100> preferential orientation growth condition is applied to homoepitaxially grow diamond on the growth-start surface 64a, thereby forming a single-crystalline diamond layer 65 on the substrate 64, as shown in FIG. 6B. Thereafter the substrate 64 located under the single-crystalline diamond layer 65 is removed by polishing from a lower surface, to obtain the flat single-crystalline diamond layer 65 that includes the abnormal growing parts 11 on four corners as shown in FIGS. 6C and 8C. This single-crystalline diamond layer 65 is cut with a YAG laser beam along cut lines 12 shown in FIG. 6C, thereby forming single-crystalline diamond having an upper surface 50a and four side surfaces 50b and 50c, all consisting of {100} planes and having no abnormal growing parts as shown in FIG. 1A. Flat single-crystalline diamond having a large area can be obtained by repeating the aforementioned steps.

Also in this Example, the object of the present invention can be attained by applying the <111> preferential orientation growth condition dissimilarly to the <110> preferential orientation growth condition to obtain the greatest increase in the growth rate toward the side surfaces when homoepitaxially growing diamond on a prime base material having a major surface of a {100} plane and side surfaces of {110} planes similarly to Example 1, as a matter of course.

While the plane orientations of the major surface and the side surfaces of the prime base material, the surfaces grown by vapor deposition and the cut planes in the cutting step are formed by {100}, {110} and {111} planes in each Example, the surfaces may not necessarily coincide with such plane orientations. Nevertheless, the object of the present invention can be attained when the plane orientations of these surfaces are within the range included in the aforementioned definition of the low-index planes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing single-crystalline diamond comprising the following steps:

a) providing a single-crystalline diamond base material having a base material major surface and base material side surfaces respectively extending along low-index planes;

b) vapor-depositing single-crystalline diamond on said base material major surface and said base material side surfaces to form an intermediate product; and c) cutting said intermediate product along at least one cutting plane substantially perpendicular to said base material major surface so as to cut out a cut single-crystalline diamond product from said intermediate product, wherein said single-crystalline diamond product has cut product side surfaces that extend along different low-index planes in comparison to said low-index planes along which said base material side surfaces extend.

2. The method according to claim 1, wherein said low-index planes are selected from {100}, {110}, and {111} planes, planes within 5° with respect to {100}, {110} or {111} planes, {311}, {331}, {511}, {551}, and {771} planes, and planes within 1° with respect to {311}, {331}, {511}, {551} or {771} planes.

3. The method according to claim 1, wherein said step of vapor-depositing single-crystalline diamond is performed under a <100> orientation condition, using a methane concentration of at least 8% and a substrate temperature of not more than 1000° C.

4. The method according to claim 1, wherein said step of vapor-depositing single-crystalline diamond is carried out under a <100> orientation condition with a growth rate ratio defined as V<100>/V<111> being at least $3^{0.5}$, wherein V<100> is a vapor deposition rate in a <100> direction and V<111> is a vapor deposition rate in a <111> direction.

5. The method according to claim 1, wherein said step of vapor-depositing single-crystalline diamond is carried out under a <110> orientation condition with a growth rate ratio defined as V<100>/V<111> being at least $0.5 \times 3^{0.5}$ wherein V<100> is a vapor deposition rate in a <100> direction and V<111> is a vapor deposition rate in a <111> direction.

6. The method according to claim 1, wherein said step of vapor-depositing single-crystalline diamond is carried out under a <111> orientation condition with a methane concentration of not more than 1.5%, a substrate temperature of 1100° C., and a growth rate ratio defined as V<100>/V<111> being not more than $3^{-0.5}$ wherein V<100> is a vapor deposition rate in a <100> direction and V<111> is a vapor deposition rate in a <111> direction.

7. The method according to claim 1, wherein said low-index plane along which said base material major surface extends is a plane oriented within 5° of {100} planes, said low-index planes along which said base material side surfaces extend respectively are planes oriented within 5° of {111} planes, and said base material has a total of four of said base material side surfaces.

8. The method according to claim 1, wherein said step of cutting said intermediate product comprises cutting said intermediate product substantially into a form of a rectangular parallelepiped.

9. The method according to claim 8, wherein said low index planes along which said base material side surfaces extend are respective planes having an inclination of not more than 5° relative to {100} planes, and wherein said different low-index planes along which said cut product side surfaces extend are respective planes having an inclination of not more than 5° relative to {110} planes.

10. The method according to claim 9, further comprising providing said cut single-crystalline diamond product as a successive base material, vapor-depositing single-crystalline diamond on a major surface of said successive base material to form an enlarged intermediate product, and cutting said enlarged intermediate product to cut out from said enlarged intermediate product an enlarged cut single-crystalline diamond product having enlarged cut product side surfaces extending along respective planes having an inclination of not more than 5° relative to {100} planes.

11. The method according to claim 8, wherein said low index planes along which said base material side surfaces extend are respective planes having an inclination of not more than 5° relative to {110} planes, and wherein said different low-index planes along which said cut product side surfaces extend are respective planes having an inclination of not more than 5° relative to {100} planes.

12. The method according to claim 11, further comprising providing said cut single-crystalline diamond product as a successive base material, vapor-depositing single-crystalline diamond on a major surface of said successive base material to form an enlarged intermediate product, and cutting said enlarged intermediate product to cut out from said enlarged intermediate product an enlarged cut single-crystalline diamond product having enlarged cut product side surfaces extending along respective planes having an inclination of not more than 5° relative to {110} planes.

13. The method according to claim 1, wherein said steps of vapor-depositing and cutting are successively repeated while successively using said cut product of said step c) as said base material for a successive repetition of said step b), so as to produce a single-crystalline diamond of a size of about 10 mm×10 mm.

14. The method according to claim 1, wherein said step of vapor depositing includes growing said single-crystalline diamond on said side surfaces to attain a growth thickness in a range between 22% and 50% of an initial length of said side surfaces.

15. The method according to claim 1, wherein said base material consists of a single unitary plate of unitarily grown single-crystalline diamond material.

16. A method of producing single-crystalline diamond comprising the following steps:
   a) providing a single-crystalline diamond base material having two major surfaces extending along low-index planes and four side surfaces extending along respective planes having inclinations of not more than 50 relative to {100} planes;
   b) vapor-depositing single-crystalline diamond on said major surfaces and said side surfaces of said base material, while thereby forming inclined surfaces of vapor-deposited single-crystalline diamond extending from respective lower edges of said four side surfaces, which border on a lower one of said two major surfaces, upwardly and outwardly toward an upper plane on which an upper one of said two major surfaces lies, and while thereby forming a new grown upper surface of vapor-deposited single-crystalline diamond material above said upper plane, with depressed tapered portions formed at four corners of said new grown upper surface;
   c) removing a first portion of single-crystalline diamond material between said lower major surface and upper ends of said inclined surfaces, at the latest when said upper ends of said inclined surfaces reach said upper plane;
   d) removing a second portion of single-crystalline diamond material between said new grown upper surface and lower ends of said depressed tapered portions to form an intermediate product; and
   e) after said step d), cutting said intermediate product along at least one plane substantially perpendicular to said major surfaces so as to cut out from said intermediate product a single-crystalline diamond substantially in a form of a rectangular parallelepiped.

17. The method according to claim 16, wherein said step b) is terminated and said step c) is carried out when said upper ends of said inclined surfaces have just reached said upper plane, and wherein said step c) comprises entirely removing said base material.

18. The method according to claim 16, wherein said removing steps are carried out by grinding or polishing.

19. The method according to claim 16, wherein said step of vapor-depositing single-crystalline diamond is performed under a <100> orientation condition using a methane concentration of at least 8% and a substrate temperature of not more than 1000° C.

20. The method according to claim 16, wherein said step of vapor-depositing single-crystalline diamond is performed under a <100> orientation condition, with a growth rate ratio defined as V<100>/V<111> being at least $3^{0.5}$, wherein V<100> is a vapor deposition rate in a <100> direction and V<111> is a vapor deposition rate in a <111> direction.

21. The method according to claim 16, wherein said low-index planes are selected from {100}, {110}, and {111} planes, planes within 5° with respect to {100}, {110} or {111} planes, {311}, {331}, {511}, {551}, and {771} planes, and planes within 1° with respect to {311}, {331}, {511}, {551} or {771} planes.

22. The method according to claim 16, wherein said base material consists of a single unitary plate of unitarily grown single-crystalline diamond material.

23. A method of producing single-crystalline diamond comprising the following steps:
   a) providing a single-crystalline diamond base material having two major surfaces extending along low-index planes and four side surfaces extending along planes respectively having an inclination within 5° with respect to {110} planes;
   b) growing single-crystalline diamond on an upper one of said major surfaces and on said side surfaces of said base material so as to form a newly grown upper surface of said single-crystalline diamond grown on said upper major surface of said base material and respective pairs of newly grown inclined surfaces of said single-crystalline diamond grown respectively on said four side surfaces, wherein each of said inclined surfaces respectively has an inclination within 5° with respect to {111} planes and an edge line along an outer edge of said inclined surface protruding outwardly away from said side surface respectively, and terminating said growing no later than a stage at which said edge lines of said inclined surfaces of each said pair respectively join one another at an intersection of said inclined surfaces of each said pair respectively thereby covering any growth plane parallel to a respective one of said side surfaces, so as to form an intermediate product;
   c) after terminating said growing, removing a first portion of said intermediate product between said newly grown upper surface and a first plane defined by said edge lines of said newly grown inclined surfaces extending from said newly grown upper surface, so as to form a growth-start surface along said first plane, consisting of a plane having an inclination within 5° with respect to a {100} plane;
   d) vapor-depositing single-crystalline diamond on said growth-start surface to form a new single-crystalline diamond layer;
   e) removing a second portion of said intermediate product between a lower surface of said intermediate product and said growth-start surface; and
   f) after said step e), cutting at least said new single-crystalline diamond layer along a plane substantially perpendicular to said growth-start surface so as to cut out a single-crystalline diamond product substantially in a form of a rectangular parallelepiped.

24. The method according to claim 23, wherein said step of vapor-depositing single-crystalline diamond is performed under a <110> orientation condition, with a growth rate ratio defined as V<100>/V<111> being $0.5 \times 3^{0.5}$, wherein V<100> is the vapor deposition rate in a <100> direction and V<111> is the vapor deposition rate in a <111> direction.

25. The method according to claim 23, wherein said step of vapor-depositing single-crystalline diamond is performed under a <111> orientation condition with a methane concentration of not more than 1.5%, a substrate temperature of 1100° C., and a growth rate ratio defined as V<100>/V<111> being not more than $3^{-0.5}$, therein V<100> is the vapor deposition rate in a <100> direction and V<111> is the vapor deposition rate in a <111>direction.

26. The method according to claim 23, wherein said low-index planes are selected from {100}, {110}, and {111} planes, planes within 5° with respect to {100}, {110}, or {111} planes, {311}, {331}, {511}, {551}, and {771} planes, and planes within 10 with respect to {311}, {331}, {511}, {551} or {771} planes.

27. The method according to claim 23, wherein said base material consists of a single unitary plate of unitarily grown single-crystalline diamond material.

* * * * *

UNITED STATES PATENT AND TRADEMARK OFFICE
CERTIFICATE OF CORRECTION

PATENT NO. : 6,096,129
DATED : August 1, 2000
INVENTOR(S) : Saito et al.

It is certified that error appears in the above-identified patent and that said Letters Patent is hereby corrected as shown below:

Title page:
Under Item [45], delete "*"; following item [73] and above item [21] delete:
"[*] Notice: This patent is subject to a terminal disclaimer.";
Under item [56] OTHER PUBLICATIONS, second column, line 14, replace "Quantitiative" by -- Quantitative --;

Column 1,
Line 18, after "as", insert -- a --;

Column 3,
Line 53, before "inventive", replace "parallelepiped he" by -- parallelepiped, the --;

Column 14,
Line 28, after "than", replace "50" by -- 5° --;

Column 16,
Line 31, after ",", replace "therein" by --wherein --;
Line 38, after "within", replace "10" by -- 1°--.

Signed and Sealed this

Seventh Day of August, 2001

*Attest:*

NICHOLAS P. GODICI
*Attesting Officer*   *Acting Director of the United States Patent and Trademark Office*